(12) United States Patent
Cardinali et al.

(10) Patent No.: US 11,527,729 B2
(45) Date of Patent: Dec. 13, 2022

(54) ELECTRONIC DEVICES INCLUDING SEMICONDUCTING LAYERS COMPRISING AT LEAST ONE BORATE COMPLEX AND METHODS FOR PREPARING THE SAME

(71) Applicant: Novaled GmbH, Dresden (DE)

(72) Inventors: Francois Cardinali, Dresden (DE);
Jerome Ganier, Dresden (DE);
Carsten Rothe, Dresden (DE);
Benjamin Schulze, Dresden (DE)

(73) Assignee: Novaled GmbH, Dresden (DE)

( * ) Notice: Subject to any disclaimer, the term of this patent is extended or adjusted under 35 U.S.C. 154(b) by 289 days.

(21) Appl. No.: 16/956,368

(22) PCT Filed: Dec. 21, 2018

(86) PCT No.: PCT/EP2018/086503
§ 371 (c)(1),
(2) Date: Jun. 19, 2020

(87) PCT Pub. No.: WO2019/122300
PCT Pub. Date: Jun. 27, 2019

(65) Prior Publication Data
US 2021/0083188 A1   Mar. 18, 2021

(30) Foreign Application Priority Data

Dec. 22, 2017 (EP) .................................. 17210277

(51) Int. Cl.
*H01L 51/00* (2006.01)
*H01L 51/50* (2006.01)
*H01L 51/52* (2006.01)

(52) U.S. Cl.
CPC .......... *H01L 51/008* (2013.01); *H01L 51/001* (2013.01); *H01L 51/5076* (2013.01); *H01L 51/5092* (2013.01); *H01L 51/5278* (2013.01)

(58) Field of Classification Search
None
See application file for complete search history.

(56) References Cited

U.S. PATENT DOCUMENTS

| 8,329,898 | B2 | 12/2012 | Salbeck et al. |
| 9,722,183 | B2 | 8/2017 | Fadhel et al. |
| 2014/0332789 | A1* | 11/2014 | Dorok .................... H01L 51/42 257/40 |

(Continued)

FOREIGN PATENT DOCUMENTS

EP    2786433 B1    8/2018

OTHER PUBLICATIONS

PCT International Search Report and Written Opinion for PCT Application No. PCT/EP2018/086503 dated Mar. 22, 2019 (8 pages).

(Continued)

*Primary Examiner* — Nduka E Ojeh
(74) *Attorney, Agent, or Firm* — Eversheds Sutherland (US) LLP

(57) ABSTRACT

Electronic devices and methods for preparing electronic devices. Electronic devices may include a semiconducting layer, which may include at least one borate complex. Borate complex may include a metal, such as Ca or Sr, and at least one borate ligand. Borate ligands may include a heterocyclic group. Methods may include evaporating a borate complex.

17 Claims, 2 Drawing Sheets

(56) References Cited

U.S. PATENT DOCUMENTS

2014/0332790 A1* 11/2014 Fadhel ............... C07D 221/18
257/40
2019/0198767 A1 6/2019 Zollner et al.

OTHER PUBLICATIONS

Trofimenko, S. ED., "Boron-Pyrazole Chemistry. II. Poly(1-pyrazolyl)borates)," Journal of the American Chemical Society, 1967, 89(13):3170-3177.

* cited by examiner

ELECTRONIC DEVICES INCLUDING SEMICONDUCTING LAYERS COMPRISING AT LEAST ONE BORATE COMPLEX AND METHODS FOR PREPARING THE SAME

CROSS REFERENCE TO RELATED APPLICATIONS

This application is a U.S. national stage application of PCT/EP2018/086503, filed Dec. 21, 2018, which claims priority to European Application No. 17210277.4, filed Dec. 22, 2017. The content of these applications is incorporated herein by reference.

The present invention relates to an electronic device and a method for preparing the same.

BACKGROUND ART

Organic light-emitting diodes (OLEDs), which are self-emitting devices, have a wide viewing angle, excellent contrast, quick response, high brightness, excellent driving voltage characteristics, and color reproduction. A typical OLED includes an anode, a hole transport layer (HTL), an emission layer (EML), an electron transport layer (ETL), and a cathode, which are sequentially stacked on a substrate. In this regard, the HTL, the EML, and the ETL are thin films formed from organic and/or organometallic compounds.

When a voltage is applied to the anode and the cathode, holes injected from the anode electrode move to the EML, via the HTL, and electrons injected from the cathode electrode move to the EML, via the ETL. The holes and electrons recombine in the EML to generate excitons. When the excitons drop from an excited state to a ground state, light is emitted. The injection and flow of holes and electrons should be balanced, so that an OLED having the above-described structure has excellent efficiency.

Borate complexes for use in organic electronic devices are known in the prior art, for example from the European patent application EP 2 786 433 A1.

However, there is still a need to further improve a cell performance of organic electronic devices comprising borate complexes, in particular to improve lifetime and driving voltage thereof.

It is, therefore, an object of the present invention to provide novel compounds for use in semiconducting layers of organic electronic devices overcoming drawbacks of the prior art, in particular such compounds suitable to improve the performance of the organic electronic device. In particular, it is an object to provide novel borate complexes showing favorable properties with respect to the thermal properties thereof and performance in organic electronic devices. Furthermore, such borate complexes shall be provided enabling broad selection of applicable matrix materials in comparison with compounds known in the art.

DESCRIPTION OF THE INVENTION

This object is achieved by an electronic device comprising a semiconducting layer comprising a borate complex comprising a metal selected from Ca and Sr and at least one borate ligand, wherein the borate ligand comprises at least one heterocyclic group.

It was surprisingly found by the inventors that the use of borate complexes of the above structure in electronic device enables a broad selection of applicable matrix materials, in particular in comparison with Mg analogues known in the art. Furthermore, it was surprisingly found by the inventors that the Ca and Sr compounds show favorable processing properties in comparison with their Mg and Ba analogues known in the art, particularly, over the Ba analogues known in the art.

In the electronic device, the heterocyclic group may be a heteroaryl group, preferably a $C_2$-$C_{30}$ heteroaryl group. Respective choices allow fine tuning of the electronic structure of the inventive borate complex to improve the usability thereof in semiconducting layers of electronic devices, in particular in the electron transport layer, the electron injection layer or the electron generation layer thereof.

In the electronic device, the heterocyclic group may comprise one or more heteroatoms independently selected from N, O and S. Respective choices allow fine tuning of the electronic structure of the inventive borate complex to improve the usability thereof in semiconducting layers of electronic devices, in particular in the electron transport layer, the electron injection layer or the electron generation layer thereof.

In the electronic device, the heterocyclic group may comprise a five-membered heterocyclic ring. Respective choices allow fine tuning of the electronic structure of the inventive borate complex to improve the usability thereof in semiconducting layers of electronic devices, in particular in the electron transport layer, the electron injection layer or the electron generation layer thereof.

In the electronic device, the heterocyclic group may comprise an azole or a diazole ring. Respective choices allow fine tuning of the electronic structure of the inventive borate complex to improve the usability thereof in semiconducting layers of electronic devices, in particular in the electron transport layer, the electron injection layer or the electron generation layer thereof.

In the electronic device, the heterocyclic group may be a 1,2-diazole group, alternatively a 1,2-diazole-1-yl group. Respective choices allow fine tuning of the electronic structure of the inventive borate complex to improve the usability thereof in semiconducting layers of electronic devices, in particular in the electron transport layer, the electron injection layer or the electron generation layer thereof.

In the electronic device, the borate ligand may comprise at least two, alternatively three, alternatively four heterocyclic groups. Respective choices allow fine tuning of the electronic structure of the inventive borate complex to improve the usability thereof in semiconducting layers of electronic devices, in particular in the electron transport layer, the electron injection layer or the electron generation layer thereof.

In the electronic device, at least two heterocyclic groups in the borate ligand may have, each individually, their heteroatoms in the beta-position with respect to the central boron atom of the borate ligand. Respective choices allow fine tuning of the electronic structure of the inventive borate complex to improve the usability thereof in semiconducting layers of electronic devices, in particular in the electron transport layer, the electron injection layer or the electron generation layer thereof.

In the electronic device, the borate complex may have the following formula (I)

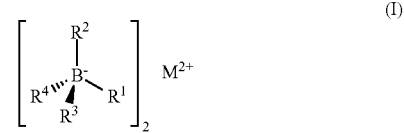

wherein M is the metal selected from Ca and Sr, and R¹ to R⁴ are independently selected from the group consisting of H, substituted or unsubstituted $C_6$ to $C_{30}$ aryl and substituted or unsubstituted $C_2$ to $C_{30}$ heteroaryl. Respective choices allow ne tuning of the electronic structure of the inventive borate complex to improve the usability thereof in semiconducting layers of electronic devices, in particular in the electron transport layer, the electron injection layer or the electron generation layer thereof.

In case that the respective $C_6$-$C_{30}$ aryl or the respective $C_2$-$C_{30}$ heteroaryl is substituted, the substituents, if present, may be independently selected from the group consisting of $C_1$ to $C_{20}$ linear alkyl, $C_3$-$C_{20}$ branched alkyl, $C_3$-$C_{20}$ cyclic alkyl, $C_1$-$C_{20}$ linear alkoxy, $C_3$-$C_{20}$ branched alkoxy, linear fluorinated $C_1$-$C_{12}$ alkyl, linear fluorinated $C_1$-$C_{12}$ alkoxy, $C_3$-$C_{12}$ branched fluorinated cyclic alkyl, $C_3$-$C_{12}$ fluorinated cyclic alkyl, $C_3$-$C_{12}$ fluorinated cyclic alkoxy, CN, $C_6$-$C_{20}$ aryl, $C_2$-$C_{20}$ heteroaryl, OR, SR, (C=O)R, (C=O)NR2, $SiR_3$, (S=O)R, (S=O)$_2$R, CR=CR$_2$, Fluorine, NR$_2$, NO$_2$.

In the electronic device, R¹ to R⁴ may be independently selected from substituted or unsubstituted $C_2$ to $C_{20}$ heteroaryl. Respective choices allow fine tuning of the electronic structure of the inventive borate complex to improve the usability thereof in semiconducting layers of electronic devices, in particular in the electron transport layer, the electron injection layer or the electron generation layer thereof.

In the electronic device, the heteroaryl may be a nitrogen-containing heteroaryl. Respective choices allow fine tuning of the electronic structure of the inventive borate complex to improve the usability thereof in semiconducting layers of electronic devices, in particular in the electron transport layer, the electron injection layer or the electron generation layer thereof.

In the electronic device, the heteroaryl may be a $C_2$ to $C_5$ heteroaryl containing up to three heteroatoms independently selected from O, N and S. Respective choices allow fine tuning of the electronic structure of the inventive borate complex to improve the usability thereof in semiconducting layers of electronic devices, in particular in the electron transport layer, the electron injection layer or the electron generation layer thereof.

In the electronic device, at least two, alternatively at least three, alternatively at least four of R¹ to R⁴ may be pyrazolyl. Respective choices allow fine tuning of the electronic structure of the inventive borate complex to improve the usability thereof in semiconducting layers of electronic devices, in particular in the electron transport layer, the electron injection layer or the electron generation layer thereof.

In the electronic device, all of R¹ to R⁴ may be structurally identical. Respective choices allow fine tuning of the electronic structure of the inventive borate complex to improve the usability thereof in semiconducting layers of electronic devices, in particular in the electron transport layer, the electron injection layer or the electron generation layer thereof.

In the electronic device, all R¹ to R⁴ may be pyrazolyl. Respective choices allow fine tuning of the electronic structure of the inventive borate complex to improve the usability thereof in semiconducting layers of electronic devices, in particular in the electron transport layer, the electron injection layer or the electron generation layer thereof.

In the electronic device, the nitrogen-containing heteroaryl group may be linked to the central boron atom through a B—N covalent bond. Respective choices allow fine tuning of the electronic structure of the inventive borate complex to improve the usability thereof in semiconducting layers of electronic devices, in particular in the electron transport layer, the electron injection layer or the electron generation layer thereof.

In the electronic device, the semiconducting layer may be arranged between a first electrode and a second electrode. The first electrode may be a cathode and the second electrode may be an anode.

In the electronic device, the semiconducting layer may be a charge transport layer and/or a charge injection layer and/or a charge generation layer.

In the electronic device, the charge transport layer may be an electron transport layer and/or the charge injections layer may be an electron injection layer and/or the charge generation layer may be an electron generation layer.

In the electronic device, the semiconducting layer may further comprise at least one organic matrix compound.

The electronic device may comprise at least one light emitting layer and thus serve as an electroluminescent device. The electroluminescent device may be an organic light emitting diode.

The object is further achieved by a method for preparing an electronic device according to the present invention, wherein the process comprises the steps of (i) evaporating a borate complex comprising a metal selected from Ca and Sr and at least one borate ligand, wherein the borate ligand comprises at least one heterocyclic group, at an elevated temperature and optionally at a reduced pressure, and (ii) depositing the vapor of the borate complex on a solid support.

In the inventive method, the borate complex may have the general formula (I)

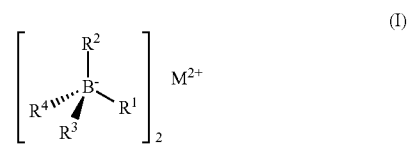

wherein M is the metal selected from Ca and Sr and R¹ to R⁴ are independently selected from the group consisting of H, substituted or unsubstituted $C_6$ to $C_{30}$ aryl and substituted or unsubstituted $C_2$-$C_{30}$ heteroaryl.

In the inventive method, the evaporating may be within a temperature range from 100 to 500° C.

In the inventive method, the evaporating may be at a pressure within a range from $10^{-8}$ to $10^{-3}$ torr.

Two particularly preferred borate complexes in accordance with the invention are the compounds E1 and E2 having the following structures.

compound E1

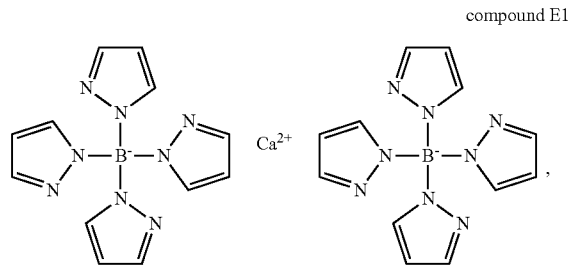

CAS 12149-62-1

-continued compound E2

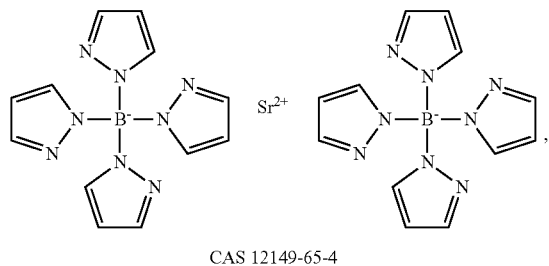

CAS 12149-65-4

In the inventive method, the solid support may be any suitable adjacent layer. For example in case of the borate complex being comprised in an electron transport layer, the solid support may be an electron injection layer. Likewise, in case that the inventive borate complex is comprised in an electron injection layer, the solid support may be the electrode.

Further Layers

In accordance with the invention, the organic electronic device may comprise, besides the layers already mentioned above, further layers. Exemplary embodiments of respective layers are described in the following:

Substrate

The substrate may be any substrate that is commonly used in manufacturing of, electronic devices, such as organic light-emitting diodes. If light is to be emitted through the substrate, the substrate shall be a transparent or semitransparent material, for example a glass substrate or a transparent plastic substrate. If light is to be emitted through the top surface, the substrate may be both a transparent as well as a non-transparent material, for example a glass substrate, a plastic substrate, a metal substrate or a silicon substrate.

Anode Electrode

Either the first electrode or the second electrode may be an anode electrode. The anode electrode may be formed by depositing or sputtering a material that is used to form the anode electrode. The material used to form the anode electrode may be a high work-function material, so as to facilitate hole injection. The anode material may also be selected from a low work function material (i.e. aluminum). The anode electrode may be a transparent or reflective electrode. Transparent conductive oxides, such as indium tin oxide (ITO), indium zinc oxide (IZO), tin-dioxide (SnO2), aluminum zinc oxide (AlZO) and zinc oxide (ZnO), may be used to form the anode electrode. The anode electrode may also be formed using metals, typically silver (Ag), gold (Au), or metal alloys.

Hole Injection Layer

The hole injection layer (HIL) may be formed on the anode electrode by vacuum deposition, spin coating, printing, casting, slot-die coating, Langmuir-Blodgett (LB) deposition, or the like. When the HIL is formed using vacuum deposition, the deposition conditions may vary according to the compound that is used to form the HIL, and the desired structure and thermal properties of the HIL. In general, however, conditions for vacuum deposition may include a deposition temperature of 100° C. to 500° C., a pressure of 10-8 to 10-3 Torr (1 Torr equals 133.322 Pa), and a deposition rate of 0.1 to 10 nm/sec.

When the HIL is formed using spin coating or printing, coating conditions may vary according to the compound that is used to form the HIL, and the desired structure and thermal properties of the HIL. For example, the coating conditions may include a coating speed of about 2000 rpm to about 5000 rpm, and a thermal treatment temperature of about 80° C. to about 200° C. Thermal treatment removes a solvent after the coating is performed.

The HIL may be formed of any compound that is commonly used to form a HIL. Examples of compounds that may be used to form the HIL include a phthalocyanine compound, such as copper phthalocyanine (CuPc), 4,4',4"-tris (3-methylphenylphenylamino) triphenylamine (m-MTDATA), TDATA, 2T-NATA, polyaniline/dodecylbenzenesulfonic acid (Pani/DBSA), poly(3,4-ethylenedioxythiophene)/poly(4-styrenesulfonate)(PEDOT/PSS), polyaniline/camphor sulfonic acid (Pani/CSA), and polyaniline)/poly(4-styrenesulfonate (PANI/PSS).

The HIL may be a pure layer of p-type dopant and the p-type dopant may be selected from tetrafluoro-tetracyanoquinonedimethane (F4TCNQ), 2,2'-(perfluoronaphthalen-2,6-diylidene) dimalononitrile or 2,2',2"-(cyclopropane-1,2,3-triylidene)tris(2-(p-cyanotetrafluorophenyl)acetonitrile) but not limited hereto. The HIL may be selected from a hole-transporting matrix compound doped with a p-type dopant. Typical examples of known doped hole transport materials are: copper phthalocyanine (CuPc), which HOMO level is approximately −5.2 eV, doped with tetrafluoro-tetracyanoquinonedimethane (F4TCNQ), which LUMO level is about −5.2 eV; zinc phthalocyanine (ZnPc)(HOMO=−5.2 eV) doped with F4TCNQ; α-NPD (N,N'-Bis(naphthalen-1-yl)-N,N'-bis(phenyl)-benzidine) doped with F4TCNQ. α-NPD doped with 2,2'-(perfluoronaphthalen-2,6-diylidene) dimalononitrile. α-NPD doped with 2,2',2"-(cyclopropane-1,2,3-triylidene)tris(2-(p-cyanotetrafluorophenyl)acetonitrile).

Dopant concentrations can be selected from 1 to 20 wt.-%, more preferably from 3 wt.-% to 10 wt.-%.

The thickness of the HIL may be in the range from about 1 nm to about 100 nm, and for example, from about 1 nm to about 25 nm. When the thickness of the HIL is within this range, the HIL may have excellent hole injecting characteristics, without a substantial penalty in driving voltage.

Hole Transport Layer

The hole transport layer (HTL) may be formed on the HIL by vacuum deposition, spin coating, slot-die coating, printing, casting, Langmuir-Blodgett (LB) deposition, or the like. When the HTL is formed by vacuum deposition or spin coating, the conditions for deposition and coating may be similar to those for the formation of the HIL. However, the conditions for the vacuum or solution deposition may vary, according to the compound that is used to form the HTL.

The HTL may be formed of any compound that is commonly used to form a HTL. Compounds that can be suitably used are disclosed for example in Yasuhiko Shirota and Hiroshi Kageyama, Chem. Rev. 2007, 107, 953-1010 and incorporated by reference. Examples of the compound that may be used to form the HTL are: carbazole derivatives, such as N-phenylcarbazole or polyvinylcarbazole; benzidine derivatives, such as N,N'-bis(3-methylphenyl)-N,N'-diphenyl-[1,1-biphenyl]-4,4'-diamine (TPD), or N,N'-di(naphthalen-1-yl)-N,N'-diphenyl benzidine (alpha-NPD); and triphenylamine-based compound, such as 4,4',4"-tris(N-carbazolyl)triphenylamine (TCTA). Among these compounds, TCTA can transport holes and inhibit excitons from being diffused into the EML.

The thickness of the HTL may be in the range of about 5 nm to about 250 nm, preferably, about 10 nm to about 200 nm, further about 20 nm to about 190 nm, further about 40 nm to about 180 nm, further about 60 nm to about 170 nm, further about 80 nm to about 160 nm, further about 100 nm to about 160 nm, further about 120 nm to about 140 nm. A preferred thickness of the HTL may be 170 nm to 200 nm.

When the thickness of the HTL is within this range, the HTL may have excellent hole transporting characteristics, without a substantial penalty in driving voltage.

Electron Blocking Layer

The function of the electron blocking layer (EBL) is to prevent electrons from being transferred from the emission layer to the hole transport layer and thereby confine electrons to the emission layer. Thereby, efficiency, operating voltage and/or lifetime are improved. Typically, the electron blocking layer comprises a triarylamine compound. The triarylamine compound may have a LUMO level closer to vacuum level than the LUMO level of the hole transport layer. The electron blocking layer may have a HOMO level that is further away from vacuum level compared to the HOMO level of the hole transport layer. The thickness of the electron blocking layer may be selected between 2 and 20 nm.

The electron blocking layer may comprise a compound of formula Z below (Z).

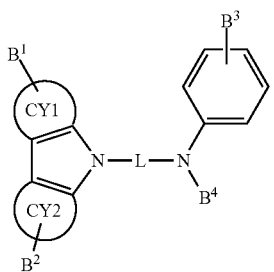

In Formula Z, CY1 and CY2 are the same as or different from each other, and each independently represent a benzene cycle or a naphthalene cycle, $B^1$ to $B^3$ are the same as or different from each other, and each independently selected from the group consisting of hydrogen; a substituted or unsubstituted aryl group having 6 to 30 carbon atoms; and a substituted or unsubstituted heteroaryl group having 5 to 30 carbon atoms, $B^4$ is selected from the group consisting of a substituted or unsubstituted phenyl group, a substituted or unsubstituted biphenyl group, a substituted or unsubstituted terphenyl group, a substituted or unsubstituted triphenylene group, and a substituted or unsubstituted heteroaryl group having 5 to 30 carbon atoms, L is a substituted or unsubstituted arylene group having 6 to 30 carbon atoms.

If the electron blocking layer has a high triplet energy level, it may also be described as triplet control layer.

The function of the triplet control layer is to reduce quenching of triplets if a phosphorescent green or blue emission layer is used. Thereby, higher efficiency of light emission from a phosphorescent emission layer can be achieved. The triplet control layer is selected from triarylamine compounds with a triplet level above the triplet level of the phosphorescent emitter in the adjacent emission layer. Suitable compounds for the triplet control layer, in particular the triarylamine compounds, are described in EP 2 722 908 A1.

Emission Layer (EML)

The EML may be formed on the HTL by vacuum deposition, spin coating, slot-die coating, printing, casting, LB deposition, or the like. When the EML is formed using vacuum deposition or spin coating, the conditions for deposition and coating may be similar to those for the formation of the IL. However, the conditions for deposition and coating may vary, according to the compound that is used to form the EML.

The emission layer (EML) may be formed of a combination of a host and an emitter dopant. Example of the host are Alq3, 4,4'-N,N'-dicarbazole-biphenyl (CBP), poly(n-vinylcarbazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBI), 3-tert-butyl-9,10-di-2-naphthylanthracence (TBADN), distyrylarylene (DSA), bis(2-(2-hydroxyphenyl)benzo-thiazolate)zinc (Zn(BTZ)2), G3 below, "AND", Compound 1 below, and Compound 2 below.

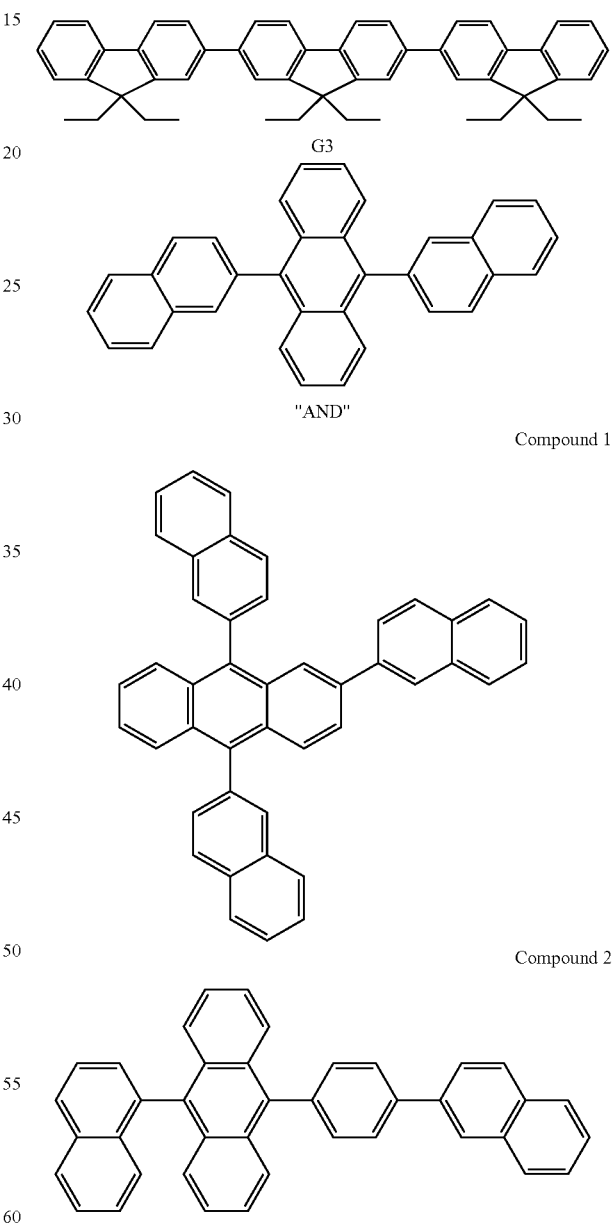

The emitter dopant may be a phosphorescent or fluorescent emitter. Phosphorescent emitters and emitters which emit light via a thermally activated delayed fluorescence (TADF) mechanism may be preferred due to their higher efficiency. The emitter may be a small molecule or a polymer.

Examples of red emitter dopants are PtOEP, Ir(piq)3, and Btp2Ir(acac), but are not limited thereto. These compounds are phosphorescent emitters, however, fluorescent red emitter dopants could also be used.

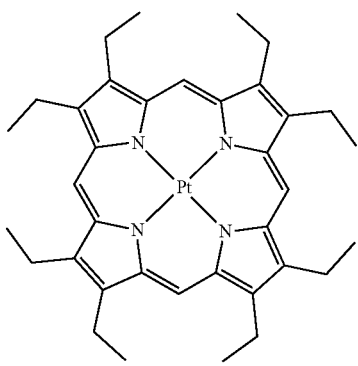

PtOEP

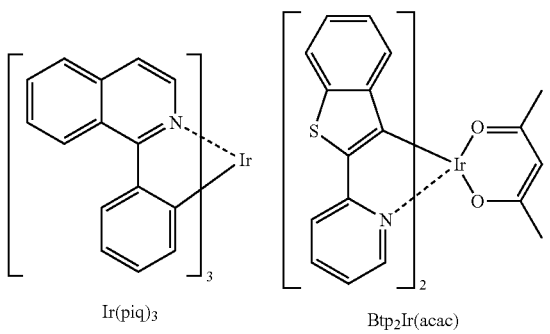

Ir(piq)3   Btp2Ir(acac)

Examples of phosphorescent green emitter dopant are Ir(ppy)3 (ppy=phenylpyridine), Ir(ppy)2(acac), Ir(mpyp)3 are shown below. Compound 3 is an example of a fluorescent green emitter and the structure is shown below.

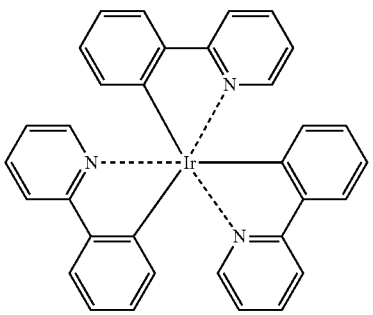

Ir(ppy)3

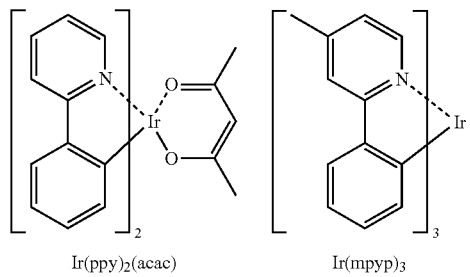

Ir(ppy)2(acac)   Ir(mpyp)3

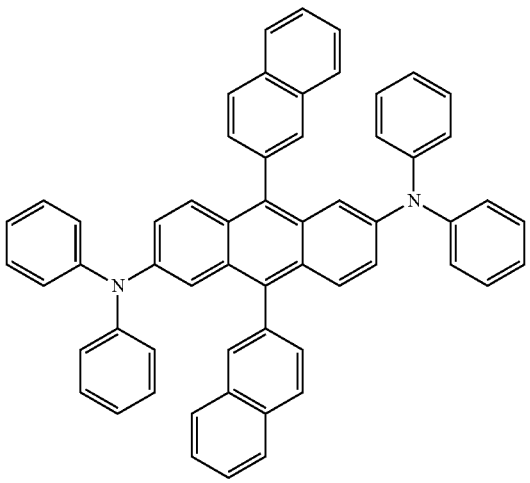

Compound 3

Examples of phosphorescent blue emitter dopants are F2Irpic, (F2ppy)2Ir(tmd) and Ir(dfppz)3, ter-fluorene, the structures are shown below. 4,4'-bis(4-diphenyl aminostyryl)biphenyl (DPAVBi), 2,5,8,11-tetra-tert-butyl perylene (TBPe), and Compound 4 below are examples of fluorescent blue emitter dopants

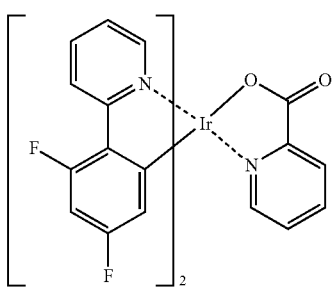

F2Irpic

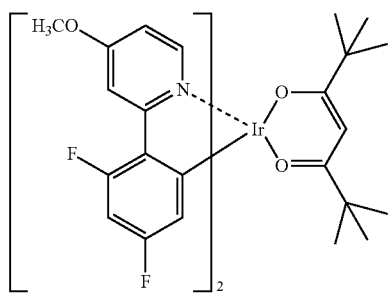

(F2ppy)2Ir(tmd)

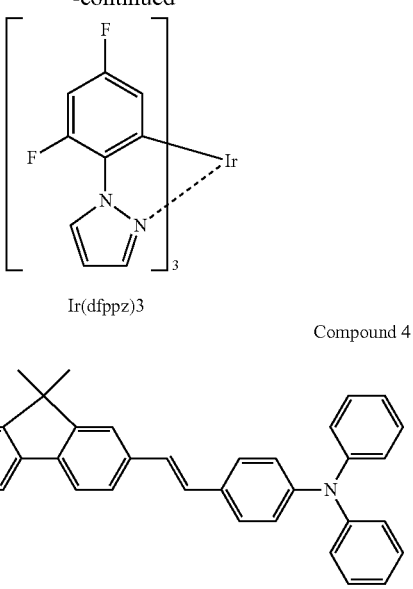

Ir(dfppz)3

Compound 4

The amount of the emitter dopant may be in the range from about 0.01 to about 50 parts by weight, based on 100 parts by weight of the host. Alternatively, the emission layer may consist of a light-emitting polymer. The EML may have a thickness of about 10 nm to about 100 nm, for example, from about 20 nm to about 60 nm. When the thickness of the EML is within this range, the EML may have excellent light emission, without a substantial penalty in driving voltage.

Hole Blocking Layer (HBL)

A hole blocking layer (HBL) may be formed on the EML, by using vacuum deposition, spin coating, slot-die coating, printing, casting, LB deposition, or the like, in order to prevent the diffusion of holes into the ETL. When the EML comprises a phosphorescent dopant, the HBL may have also a triplet exciton blocking function.

When the HBL is formed using vacuum deposition or spin coating, the conditions for deposition and coating may be similar to those for the formation of the HIL. However, the conditions for deposition and coating may vary, according to the compound that is used to form the HBL. Any compound that is commonly used to form a HBL may be used. Examples of compounds for forming the HBL include oxadiazole derivatives, triazole derivatives, and phenanthroline derivatives.

The HBL may have a thickness in the range from about 5 nm to about 100 in, for example, from about 10 mm to about 30 nm. When the thickness of the HBL is within this range, the HBL may have excellent hole-blocking properties, without a substantial penalty in driving voltage.

Electron Transport Layer (ETL)

The OLED according to the present invention may contain an electron transport layer (ETL). In accordance with the invention, the electron transport layer may be the inventive organic semiconducting layer comprising the inventive borate complex as defined above.

According to various embodiments the OLED may comprise an electron transport layer or an electron transport layer stack comprising at least a first electron transport layer and at least a second electron transport layer.

By suitably adjusting energy levels of particular layers of the ETL, the injection and transport of the electrons may be controlled, and the holes may be efficiently blocked. Thus, the OLED may have long lifetime.

The electron transport layer of the organic electronic device may comprise the borate complex as defined above as the organic electron transport matrix (ETM) material. The electron transport layer may comprise, besides the borate complex, further ETM materials known in the art. Likewise, the electron transport layer may comprise as the only electron transport matrix material the borate complex. In case that the inventive organic electronic device comprises more than one electron transport layers, the borate complex may be comprised in only one of the electron transport layers, in more than one of the electron transport layers or in all of the electron transport layers. In accordance with the invention, the electron transport layer may comprise, besides the ETM material, at least one additive as defined below. Further, the electron transport layer may comprise one or more n-type dopants. The additive may be an n-type dopant. The additive can be alkali metal, alkali metal compound, alkaline earth metal, alkaline earth metal compound, transition metal, transition metal compound or a rare earth metal. In another embodiment, the metal can be one selected from a group consisting of Li, Na, K, Rb, Cs, Mg, Ca, Sr, Ba, La, Ce, Sm, Eu, Tb, Dy, and Yb. In another embodiment, the n-type dopant can be one selected from a group consisting of Cs, K, Rb, Mg, Na, Ca, Sr, Eu and Yb. In an embodiment the alkali metal compound may be 8-Hydroxyquinolinolatolithium (LiQ), Lithium tetra(1H-pyrazol-1-yl)borate or Lithium 2-(diphenylphosphoryl)phenolate. Suitable compounds for the ETM (which may be used in addition to the inventive compound represented by the general formula (I) as defined above) are not particularly limited. In one embodiment, the electron transport matrix compounds consist of covalently bound atoms. Preferably, the electron transport matrix compound comprises a conjugated system of at least 6, more preferably of at least 10 delocalized electrons. In one embodiment, the conjugated system of delocalized electrons may be comprised in aromatic or heteroaromatic structural moieties, as disclosed e.g. in documents EP 1970 371 A1 or WO 2013/079217 A1.

Electron Injection Layer (EIL)

The optional EIL, which may facilitates injection of electrons from the cathode, may be formed on the ETL, preferably directly on the electron transport layer. In accordance with the invention, the EEL may be the semiconducting layer comprising the borate complex. If the borate complex is not comprised in the EIL but in another layer, for example the ETL, the EIL material may be selected from materials known in the art for a respective use. Examples of materials for forming the EIL include lithium 8-hydroxyquinolinolate (LiQ), LiF, NaCl, CsF, Li2O, BaO, Ca, Ba, Yb, Mg which are known in the art. Deposition and coating conditions for forming the EIL are similar to those for formation of the HIL, although the deposition and coating conditions may vary, according to the material that is used to form the EIL.

The thickness of the EIL may be in the range from about 0.1 nm to about 10 nm, for example, in the range from about 0.5 nm to about 9 nm. When the thickness of the EEL is within this range, the EEL may have satisfactory electron-injecting properties, without a substantial penalty in driving voltage.

Cathode Electrode

The cathode electrode is formed on the EIL if present. The cathode electrode may be formed of a metal, an alloy, an electrically conductive compound, or a mixture thereof. The cathode electrode may have a low work function. For example, the cathode electrode may be formed of lithium (Li), magnesium (Mg), aluminum (Al), aluminum (Al)-lithium (Li), calcium (Ca), barium (Ba), ytterbium (Yb), magnesium (Mg)-indium (In), magnesium (Mg)-silver (Ag), or the like. Alternatively, the cathode electrode may be formed of a transparent conductive oxide, such as ITO or IZO.

The thickness of the cathode electrode may be in the range from about 5 nm to about 1000 nm, for example, in the range from about 10 nm to about 100 nm. When the thickness of the cathode electrode is in the range from about 5 nm to about 50 nm, the cathode electrode may be transparent or semitransparent even if formed from a metal or metal alloy.

It is to be understood that the cathode electrode is not part of an electron injection layer or the electron transport layer.

Charge Generation Layer/Hole Generating Layer

The charge generation layer (CGL) may be composed of a double layer.

Typically, the charge generation layer is a pn junction joining a n-type charge generation layer (electron generating layer) and a hole generating layer. The n-side of the pn junction generates electrons and injects them into the layer which is adjacent in the direction to the anode.

Analogously, the p-side of the p-n junction generates holes and injects them into the layer which is adjacent in the direction to the cathode.

Charge generating layers are used in tandem devices, for example, in tandem OLEDs comprising, between two electrodes, two or more emission layers. In a tandem OLED comprising two emission layers, the n-type charge generation layer provides electrons for the first light emission layer arranged near the anode, while the hole generating layer provides holes to the second light emission layer arranged between the first emission layer and the cathode.

Suitable matrix materials for the hole generating layer may be materials conventionally used as hole injection and/or hole transport matrix materials. Also, p-type dopant used for the hole generating layer can employ conventional materials. For example, the p-type dopant can be one selected from a group consisting of tetrafluore-7,7,8,8-tetracyanoquiodimethane (F4-TCNQ), derivatives of tetracyanoquinodimethane, radialene derivatives, iodine, FeCl3, FeF3, and SbCl5. Also, the host can be one selected from a group consisting of N,N'-di(naphthalen-1-yl)-N,N'-diphenyl-benzidine (NPB), N,N'-diphenyl-N,N'-bis(3-methylphenyl)-1,1-biphenyl-4,4'-diamine (TPD) and N,N',N'-tetranaphthyl-benzidine (TNB).

The n-type charge generation layer can be layer of a neat n-type dopant, for example of an electropositive metal, or can consist of an organic matrix material doped with the n-type dopant. In accordance with the invention, the n-type charge generation layer (=electron generating layer) may be the layer comprising the borate complex. In cases where the borate complex is not comprised in the electron generating layer, but in another layer, for example the electron transport layer or the electron injection layer, the material of the n-type charge generation layer may be selected from materials well-known in the art for this purpose. In one embodiment, the n-type dopant can be alkali metal, alkali metal compound, alkaline earth metal, alkaline earth metal compound, a transition metal, a transition metal compound or a rare earth metal. In another embodiment, the metal can be one selected from a group consisting of Li, Na, K, Rb, Cs, Mg, Ca, Sr, Ba, La, Ce, Sm, Eu, Tb, Dy, and Yb. More specifically, the n-type dopant can be one selected from a group consisting of Cs, K, Rb, Mg, Na, Ca, Sr, Eu and Yb. Suitable matrix materials for the electron generating layer may be the materials conventionally used as matrix materials for electron injection or electron transport layers. The matrix material can be for example one selected from a group consisting of triazine compounds, hydroxyquinoline derivatives like tris(8-hydroxyquinoline)aluminum, benzazole derivatives, and silole derivatives.

In one embodiment, the n-type charge generation layer may include compounds of the following Chemical Formula X.

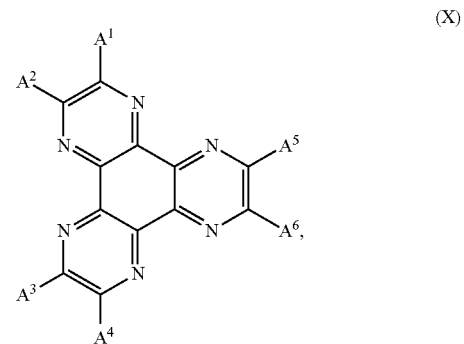

(X)

wherein each of $A^1$ to $A^6$ may be hydrogen, a halogen atom, nitrile (—CN), nitro (—NO2), sulfonyl (—SO2R), sulfoxide (—SOR), sulfonamide (—SO2NR), sulfonate (—SO3R), trifluoromethyl (—CF3), ester (—COOR), amide (—CONHR or —CONRR'), substituted or unsubstituted straight-chain or branched-chain C1-C12 alkoxy, substituted or unsubstituted straight-chain or branched-chain C1-C12 alkyl, substituted or unsubstituted straight-chain or branched chain C2-C12 alkenyl, a substituted or unsubstituted aromatic or non-aromatic heterorring, substituted or unsubstituted aryl, substituted or unsubstituted mono- or di-arylamine, substituted or unsubstituted aralkylamine, or the like. Herein, each of the above R and R' may be substituted or unsubstituted C1-C60 alkyl, substituted or unsubstituted aryl, or a substituted or unsubstituted 5- to 7-membered heterorring, or the like.

An example of such n-type charge generation layer may be a layer comprising CNHAT

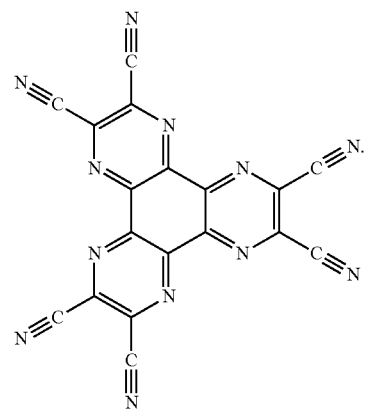

(CNHAT)

The hole generating layer is arranged on top of the n-type charge generation layer.

Organic Light-Emitting Diode (OLED)

The organic electronic device according to the invention may be an organic light-emitting device.

According to one aspect of the present invention, there is provided an organic light-emitting diode (OLED) comprising: a substrate; an anode electrode formed on the substrate; a hole injection layer, a hole transport layer, an emission layer, and a cathode electrode.

According to another aspect of the present invention, there is provided an OLED comprising: a substrate; an anode electrode formed on the substrate; a hole injection layer, a hole transport layer, an electron blocking layer, an emission layer, a hole blocking layer and a cathode electrode.

According to another aspect of the present invention, there is provided an OLED comprising: a substrate; an anode electrode formed on the substrate; a hole injection layer, a hole transport layer, an electron blocking layer, an emission layer, a hole blocking layer, an electron transport layer, and a cathode electrode.

According to another aspect of the present invention, there is provided an OLED comprising: a substrate; an anode electrode formed on the substrate; a hole injection layer, a hole transport layer, an electron blocking layer, an emission layer, a hole blocking layer, an electron transport layer, an electron injection layer, and a cathode electrode.

According to various embodiments of the present invention, there may be provided OLEDs layers arranged between the above mentioned layers, on the substrate or on the top electrode.

According to one aspect, the OLED can comprise a layer structure of a substrate that is adjacent arranged to an anode electrode, the anode electrode is adjacent arranged to a first hole injection layer, the first hole injection layer is adjacent arranged to a first hole transport layer, the first hole transport layer is adjacent arranged to a first electron blocking layer, the first electron blocking layer is adjacent arranged to a first emission layer, the first emission layer is adjacent arranged to a first electron transport layer, the first electron transport layer is adjacent arranged to an n-type charge generation layer, the n-type charge generation layer is adjacent arranged to a hole generating layer, the hole generating layer is adjacent arranged to a second hole transport layer, the second hole transport layer is adjacent arranged to a second electron blocking layer, the second electron blocking layer is adjacent arranged to a second emission layer, between the second emission layer and the cathode electrode an optional electron transport layer and/or an optional injection layer are arranged.

For example, the OLED according to FIG. 2 may be formed by a process, wherein on a substrate (110), an anode (120), a hole injection layer (130), a hole transport layer (140), an electron blocking layer (145), an emission layer (150), a hole blocking layer (155), an electron transport layer (160), an electron injection layer (180) and the cathode electrode (190) are subsequently formed in that order.

Organic Electronic Device

An organic electronic device according to the invention comprises an organic semiconducting layer comprising a compound according to formula I.

An organic electronic device according to one embodiment may include a substrate, an anode layer, an organic semiconducting layer comprising a compound of formula 1 and a cathode layer.

An organic electronic device according to one embodiment comprises at least one organic semiconducting layer comprising at least one compound of formula I, at least one anode layer, at least one cathode layer and at least one emission layer, wherein the organic semiconducting layer is preferably arranged between the emission layer and the cathode layer.

An organic light-emitting diode (OLED) according to the invention may include an anode, a hole transport layer (HTL), an emission layer (EML), an electron transport layer (ETL) comprising at least one compound of formula 1, and a cathode, which are sequentially stacked on a substrate. In this regard, the HTL, the EML, and the ETL are thin films formed from organic compounds.

An organic electronic device according to one embodiment can be a light emitting device, thin film transistor, a battery, a display device or a photovoltaic cell, and preferably a light emitting device.

In one embodiment, the device comprising a layer comprising the borate complex can further comprise a layer comprising a radialene compound and/or a quinodimethane compound.

In one embodiment, the radialene compound and/or the quinodimethane compound may be substituted with one or more halogen atoms and/or with one or more electron withdrawing groups. Electron withdrawing groups can be selected from nitrile groups, halogenated alkyl groups, alternatively from perhalogenated alkyl groups, alternatively from perfluorinated alkyl groups. Other examples of electron withdrawing groups may be acyl, sulfonyl groups or phosphoryl groups.

Alternatively, acyl groups, sulfonyl groups and/or phosphoryl groups may comprise halogenated and/or perhalogenated hydrocarbyl. In one embodiment, the perhalogenated hydrocarbyl may be a perfluorinated hydrocarbyl. Examples of a perfluorinated hydrocarbyl can be perfluormethyl, perfluorethyl, perfluorpropyl, perfluorisopropyl, perfluorobutyl, perfluorophenyl, perfluorotolyl; examples of sulfonyl groups comprising a halogenated hydrocarbyl may be trifluoromethylsulfonyl, pentafluoroethylsulfonyl, pentafluorophenylsulfonyl, heptafluoropropylsufonyl, nonafluorobutylsulfonyl, and like.

In one embodiment, the radialene and/or the quinodimethane compound may be comprised in a hole injection, hole transporting and/or a hole generation layer.

In one embodiment, the radialene compound may have formula (XX) and/or the quinodimethane compound may have formula (XXIa) or (XXIb):

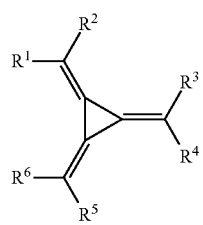
(XX)

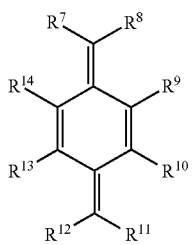
(XXIa)

-continued

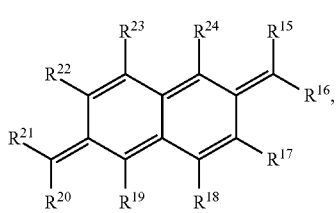

(XXIb)

wherein $R^1$, $R^2$, $R^3$, $R^4$, $R^5$, $R^6$, $R^7$, $R^8$, $R^{11}$, $R^{12}$, $R^{15}$, $R^{16}$, $R^{20}$, $R^{21}$ are independently selected from above mentioned electron withdrawing groups and $R^9$, $R^{10}$, $R^{13}$, $R^{14}$, $R^{17}$, $R^{18}$, $R^{19}$, $R^{22}$, $R^{23}$ and $R^{24}$ are independently selected from H halogen and above mentioned electron withdrawing groups.

According to another aspect of the present invention, there is provided a method of manufacturing an organic electronic device, the method using:

at least one deposition source, preferably two deposition sources and more preferred at least three deposition sources.

The methods for deposition that can be suitable comprise:
deposition via vacuum thermal evaporation;
deposition via solution processing, preferably the processing is selected from spin-coating, printing, casting; and/or
slot-die coating.

According to various embodiments of the present invention, there is provided a method using:
a first deposition source to release the compound of formula 1 according to the invention, and
a second deposition source to release the alkali halide or alkali organic complex, preferably a lithium halide or lithium organic complex;
the method comprising the steps of forming the electron transport layer stack; whereby for an organic light-emitting diode (OLED):
the first electron transport layer is formed by releasing the compound of formula 1 according to the invention from the first deposition source and an alkali metal compound, preferably an alkali halide or alkali organic complex, preferably a lithium halide or lithium organic complex from the second deposition source.

According to various embodiments of the present invention, the method may further include forming on the anode electrode an emission layer and at least one layer selected from the group consisting of forming a hole injection layer, forming a hole transport layer, or forming a hole blocking layer, between the anode electrode and the first electron transport layer.

According to various embodiments of the present invention, the method may further include the steps for forming an organic light-emitting diode (OLED), wherein
on a substrate a first anode electrode is formed,
on the first anode electrode an emission layer is formed,
on the emission layer an electron transport layer stack is formed, preferably a first electron transport layer is formed on the emission layer and optional a second electron transport layer is formed,
and finally a cathode electrode is formed,
optionally a hole injection layer, a hole transport layer, and a hole blocking layer, formed in that order between the first anode electrode and the emission layer,
optionally an electron injection layer is formed between the electron transport layer and the cathode electrode.

According to various embodiments of the present invention, the method may further include forming an electron injection layer on a first electron transport layer. However, according to various embodiments of the OLED of the present invention, the OLED may not comprise an electron injection layer.

According to various embodiments, the OLED may have the following layer structure, wherein the layers having the following order:
anode, hole injection layer, first hole transport layer, second hole transport layer, emission layer, optional second electron transport layer, first electron transport layer comprising a compound of formula 1 according to the invention, optional electron injection layer, and cathode.

According to another aspect of the invention, it is provided an electronic device comprising at least one organic light emitting device according to any embodiment described throughout this application, preferably, the electronic device comprises the organic light emitting diode in one of embodiments described throughout this application. More preferably, the electronic device is a display device.

Hereinafter, the embodiments are illustrated in more detail with reference to examples. However, the present disclosure is not limited to the following examples. Reference will now be made in detail to the exemplary aspects.

DETAILS AND DEFINITIONS OF THE INVENTION

The term "borate" refers to organo-boron anions. Suitable borates may consist of a central boron atom and four organic groups, i.e. may have the general formula $BR_4$ wherein, in accordance with the teaching of claim 1, at least one of the groups R is a heterocyclic group. The borate ligand (=borate anion) is negatively charged. The negative charge is balanced by the Ca or Sr counter-cation.

In the present specification, when a definition is not otherwise provided, an "alkyl group" may refer to an aliphatic hydrocarbon group. The alkyl group may refer to "a saturated alkyl group" without any double bond or triple bond. The term "alkyl" as used herein shall encompass linear as well as branched and cyclic alkyl. For example, $C_3$-alkyl may be selected from n-propyl and iso-propyl. Likewise, $C_4$-alkyl encompasses n-butyl, se-butyl and t-butyl. Likewise, $C_6$-alkyl encompasses n-hexyl and cyclohexyl.

The subscribed number n in $C_n$ relates to the total number of carbon atoms in the respective alkyl, arylene, heteroarylene or aryl group.

The term "aryl" or "arylene" as used herein shall encompass phenyl ($C_6$-aryl), fused aromatics, such as naphthalene, anthracene, phenanthracene, tetracene etc. Further encompassed are biphenyl and oligo- or polyphenyls, such as terphenyl etc. Further encompassed shall be any further aromatic hydrocarbon substituents, such as fluorenyl etc. Arylene, respectively heteroarylene refers to groups to which two further moieties are attached. In the present specification "arylene group" may refer to a group comprising at least one hydrocarbon aromatic moiety, and all the elements of the hydrocarbon aromatic moiety may have p-orbitals which form conjugation, for example a phenyl group, a naphtyl group, an anthracenyl group, a phenanthrenyl group, a pyrenyl group, a fluorenyl group and the like. The arylene group may include a monocyclic, polycyclic or fused ring polycyclic (i.e., rings sharing adjacent pairs of carbon atoms) functional group.

The term "heteroaryl" or "heteroarylene" as used herein refers to aryl groups in which at least one carbon atom is substituted by a heteroatom, preferably selected from N, O, S, B or Si.

The subscripted number n in $C_n$-heteroaryl merely refers to the number of carbon atoms excluding the number of heteroatoms. In this context, it is clear that a $C_3$ heteroarylene group is an aromatic compound comprising three carbon atoms, such as pyrazol, imidazole, oxazole, thiazole and the like.

The term "heteroaryl" may refer to aromatic heterocycles with at least one heteroatom, and all the elements of the hydrocarbon heteroaromatic moiety may have p-orbitals which form conjugation. The heteroatom may be selected from N, O, S, B, Si, P, Se, preferably from N, O and S. A heteroarylene ring may comprise at least 1 to 3 heteroatoms. Preferably a heteroarylene ring may comprise at least 1 to 3 heteroatoms individually selected from N, S and/or O.

The term "heteroarylene" as used herewith shall encompass pyridine, quinoline, quinazoline, pyridine, triazine, benzimidazole, benzothiazole, benzo[4,5]thieno[3,2-d]pyrimidine, carbazole, xanthene, phenoxazine, benzoacridine, dibenzoacridine and the like.

In the present specification, the single bond refers to a direct bond.

In terms of the invention, the expression "between" with respect to one layer being between two other layers does not exclude the presence of further layers which may be arranged between the one layer and one of the two other layers. In terms of the invention, the expression "in direct contact" with respect to two layers being in direct contact with each other means that no further layer is arranged between those two layers. One layer deposited on the top of another layer is deemed to be in direct contact with this layer.

With respect to the inventive organic semiconductive layer as well as with respect to the inventive compound, the compounds mentioned in the experimental part are most preferred.

The inventive organic electronic device may be an organic electroluminescent device (OLED) an organic photovoltaic device (OPV) a lighting device, or an organic field-effect transistor (OFET). A lighting device may be any of the devices used for illumination, irradiation, signaling, or projection. They are correspondingly classified as illuminating, irradiating, signaling, and projecting devices. A lighting device usually consists of a source of optical radiation, a device that transmits the radiant flux into space in the desired direction, and a housing that joins the parts into a single device and protects the radiation source and light-transmitting system against damage and the effects of the surroundings.

According to another aspect, the organic electroluminescent device according to the present invention may comprise more than one emission layer, preferably two or three emission layers. An OLED comprising more than one emission layer is also described as a tandem OLED or stacked OLED.

The organic electroluminescent device (OLED) may be a bottom- or top-emission device.

Another aspect is directed to a device comprising at least one organic electroluminescent device (OLED). A device comprising organic light-emitting diodes is for example a display or a lighting panel.

In the present invention, the following defined terms, these definitions shall be applied, unless a different definition is given in the claims or elsewhere in this specification.

In the context of the present specification the term "different" or "differs" in connection with the matrix material means that the matrix material differs in their structural formula.

The energy levels of the highest occupied molecular orbital, also named HOMO, and of the lowest unoccupied molecular orbital, also named LUMO, are measured in electron volt (eV) indirectly by cyclic voltammetry vs ferrocene or can be calculated using simulation B3LYP with a 6-31G* basis set.

The terms "OLED" and "organic light-emitting diode" are simultaneously used and have the same meaning. The term "organic electroluminescent device" as used herein may comprise both organic light emitting diodes as well as organic light emitting transistors (OLETs).

As used herein, "weight percent", "wt.-%", "percent by weight", "% by weight", and variations thereof refer to a composition, component, substance or agent as the weight of that component, substance or agent of the respective electron transport layer divided by the total weight of the respective electron transport layer thereof and multiplied by 100. It is understood that the total weight percent amount of all components, substances and agents of the respective electron transport layer and electron injection layer are selected such that it does not exceed 100 wt.-%.

As used herein, "volume percent", "vol.-%", "percent by volume", "% by volume", and variations thereof refer to a composition, component, substance or agent as the volume of that component, substance or agent of the respective electron transport layer divided by the total volume of the respective electron transport layer thereof and multiplied by 100. It is understood that the total volume percent amount of all components, substances and agents of the cathode layer are selected such that it does not exceed 100 vol.-%.

All numeric values are herein assumed to be modified by the term "about", whether or not explicitly indicated. As used herein, the term "about" refers to variation in the numerical quantity that can occur. Whether or not modified by the term "about" the claims include equivalents to the quantities.

It should be noted that, as used in this specification and the appended claims, the singular forms "a", "an", and "the" include plural referents unless the content clearly dictates otherwise.

The term "free of", "does not contain", "does not comprise" does not exclude impurities. Impurities have no technical effect with respect to the object achieved by the present invention.

In the context of the present specification the term "essentially non-emissive" or "non-emitting" means that the contribution of the compound or layer to the visible emission spectrum from the device is less than 10%, preferably less than 5% relative to the visible emission spectrum. The visible emission spectrum is an emission spectrum with a wavelength of about ≥380 nm to about ≤780 nm.

Preferably, the organic semiconducting layer comprising the compound of formula I is essentially non-emissive or non-emitting.

The operating voltage, also named U, is measured in Volt (V) at 10 milliAmpere per square centimeter (mA/cm2).

The candela per Ampere efficiency, also named cd/A efficiency is measured in candela per ampere at 10 milli-Ampere per square centimeter (mA/cm2).

The external quantum efficiency, also named EQE, is measured in percent (%).

The color space is described by coordinates CIE-x and CIE-y (International Commission on Illumination 1931).

For blue emission the CIE-y is of particular importance. A smaller CIE-y denotes a deeper blue color.

The highest occupied molecular orbital, also named HOMO, and lowest unoccupied molecular orbital, also named LUMO, are measured in electron volt (eV).

The term "OLED", "organic light emitting diode", "organic light emitting device", "organic optoelectronic device" and "organic light-emitting diode" are simultaneously used and have the same meaning.

The term "transition metal" means and comprises any element in the d-block of the periodic table, which comprises groups 3 to 12 elements on the periodic table.

The term "group III to VI metal" means and comprises any metal in groups III to VI of the periodic table.

The term "life-span" and "lifetime" are simultaneously used and have the same meaning.

All numeric values are herein assumed to be modified by the term "about", whether or not explicitly indicated. As used herein, the term "about" refers to variation in the numerical quantity that can occur.

Whether or not modified by the term "about", the claims include equivalents to the quantities.

It should be noted that, as used in this specification and the appended claims, the singular forms "a", "an", and "the" include plural referents unless the content clearly dictates otherwise.

The anode electrode and cathode electrode may be described as anode electrode/cathode electrode or anode electrode/cathode electrode or anode electrode layer/cathode electrode layer.

The dipole moment $|\vec{\mu}|$ of a molecule containing N atoms is given by:

$$\vec{\mu} = \sum_i^N q_i \vec{r}_i$$

$$|\vec{\mu}| = \sqrt{\mu_x^2 + \mu_y^2 + \mu_z^2}$$

where $q_i$ and $\vec{r}_i$ are the partial charge and position of atom in the molecule.

The dipole moment is determined by a semi-empirical molecular orbital method.

The partial charges and atomic positions in the gas phase are obtained using the hybrid functional B3LYP with a 6-31G* basis set as implemented in the program package TURBOMOLE V6.5. If more than one conformation is viable, the conformation with the lowest total energy is selected to determine the dipole moment.

The reduction potential may be determined by cyclic voltammetry with potentiostatic device Metrohm PGSTAT30 and software Metrohm Autolab GPES at room temperature. The redox potentials are measured in an argon de-aerated, anhydrous 0.1M THF solution of the compound of formula I, under argon atmosphere, with 0.1M tetrabutylammonium hexafluorophosphate as supporting electrolyte, between platinum working electrodes and with an Ag/AgCl pseudo-standard electrode (Metrohm Silver rod electrode) consisting of a silver wire covered by silver chloride and immersed directly in the measured solution, with the scan rate 100 mV/s. The first run is done in the broadest range of the potential set on the working electrodes, and the range is then adjusted within subsequent runs appropriately. The final three runs are done with the addition of ferrocene (in 0.1M concentration) as the standard. The average of potentials corresponding to cathodic and anodic peak of the compound is determined through subtraction of the average of cathodic and anodic potentials observed for the standard $Fc^+/Fc$ redox couple.

Room temperature, also named ambient temperature, is 23° C.

BRIEF DESCRIPTION OF THE DRAWINGS

These and/or other aspects and advantages of the present invention will become apparent and more readily appreciated from the following description of the exemplary embodiments, taken in conjunction with the accompanying drawings, of which.

DETAILED DESCRIPTION

Figure 1:
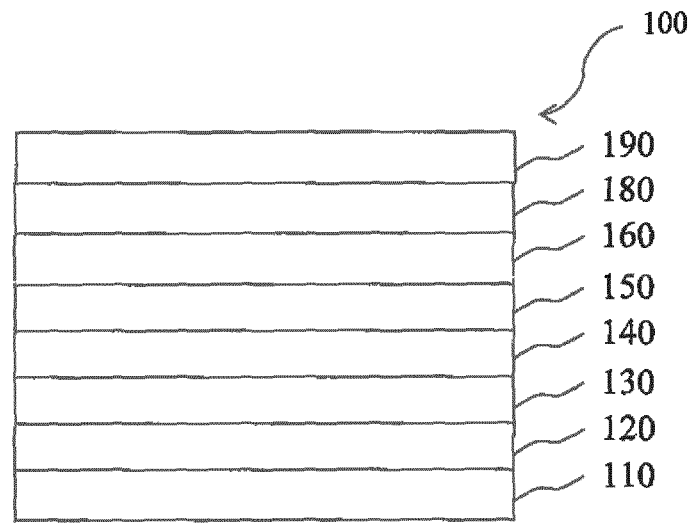
FIG. 1 is a schematic sectional view of an organic light-emitting diode (OLED), according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Herein, when a first element is referred to as being formed or disposed "on" or "onto" a second element, the first element can be disposed directly on the second element, or one or more other elements may be disposed there between. When a first element is referred to as being formed or disposed "directly on" or "directly onto" a second element, no other elements are disposed there between.

FIG. 1 is a schematic sectional view of an organic light-emitting diode (OLED) 100, according to an exemplary embodiment of the present invention. The OLED 100 includes a substrate 110, an anode 120, a hole injection layer (HIL) 130, a hole transport layer (HTL) 140, an emission layer (EML) 150, an electron transport layer (ETL) 160. The electron transport layer (ETL) 160 is formed on the EML 150. Onto the electron transport layer (ETL) 160, an electron injection layer (EIL) 180 is disposed. The cathode 190 is disposed directly onto the electron injection layer (EIL) 180.

Instead of a single electron transport layer 160, optionally an electron transport layer stack (ETL) can be used.

Figure 2:
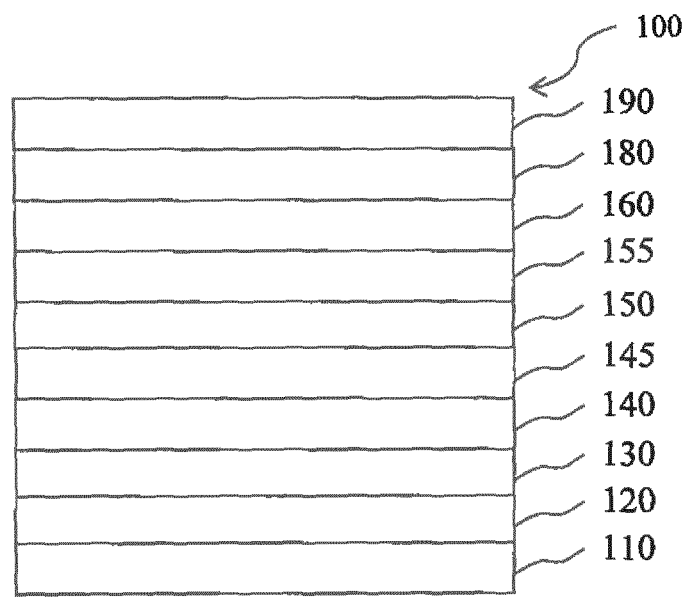
FIG. 2 is a schematic sectional view of an OLED, according to an exemplary embodiment of the present invention.

FIG. 2 is a schematic sectional view of an OLED 100, according to another exemplary embodiment of the present invention. FIG. 2 differs from FIG. 1 in that the OLED 100 of FIG. 2 comprises an electron blocking layer (EBL) 145 and a hole blocking layer (HBL) 155.

Referring to FIG. 2, the OLED 100 includes a substrate 110, an anode 120, a hole injection layer (HIL) 130, a hole transport layer (HTL) 140, an electron blocking layer (EBL) 145, an emission layer (EML) 150, a hole blocking layer (HBL) 155, an electron transport layer (ETL) 160, an electron injection layer (EIL) 180 and a cathode electrode 190.

Figure 3:
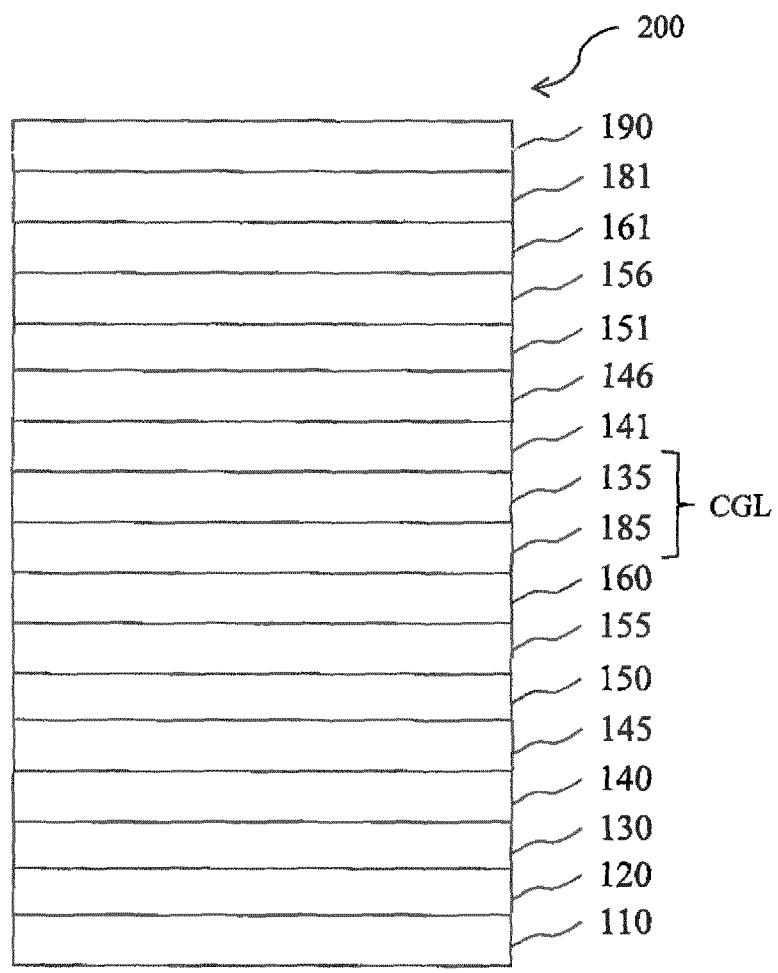
FIG. 3 is a schematic sectional view of a tandem OLED comprising a charge generation layer, according to an exemplary embodiment of the present invention.

FIG. 3 is a schematic sectional view of a tandem OLED 200, according to another exemplary embodiment of the present invention. FIG. 3 differs from FIG. 2 in that the OLED 100 of FIG. 3 further comprises a charge generation layer (CGL) and a second emission layer (151).

Referring to FIG. 3, the OLED 200 includes a substrate 110, an anode 120, a first hole injection layer (HIL) 130, a first hole transport layer (HTL) 140, a first electron blocking layer (EBL) 145, a first emission layer (EML) 150, a first hole blocking layer (HBL) 155, a first electron transport layer (ETL) 160, an n-type charge generation layer (n-type CGL) 185, a hole generating layer (p-type charge generation layer; p-type GCL) 135, a second hole transport layer (HTL) 141, a second electron blocking layer (EBL) 146, a second emission layer (EML) 151, a second hole blocking layer (EBL) 156, a second electron transport layer (ETL) 161, a second electron injection layer (EIL) 181 and a cathode 190.

While not shown in FIG. 1, FIG. 2 and FIG. 3, a sealing layer may further be formed on the cathode electrodes 190, in order to seal the OLEDs 100 and 200. In addition, various other modifications may be applied thereto.

Hereinafter, one or more exemplary embodiments of the present invention will be described in detail with, reference to the following examples. However, these examples are not intended to limit the purpose and scope of the one or more exemplary embodiments of the present invention.

Experimental Part

The inventors compared the performance of the representative compounds E1 and E2 with previous art compound B1 as a n-dopant and as a neat hole injection layer and in a model tandem OLED device.

An additional comparative material is compound B2

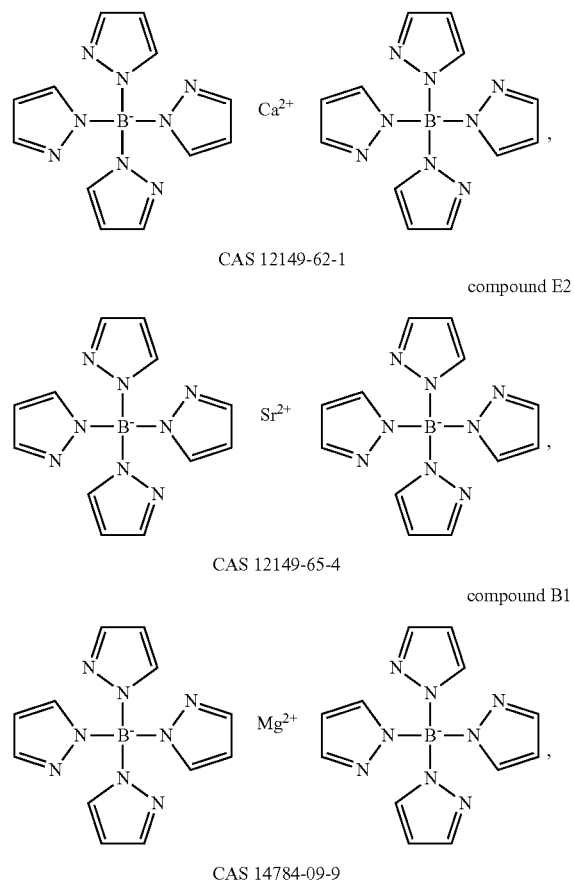

The closest state-of-art material already was disclosed as an efficient n-dopant in various matrices is lithium tetrakis (H-pyrazol-1-yl)borate, Cl, CAS 14728-62-2

Device Experiments
Generic Procedures

OLEDs with two emitting layers were prepared to demonstrate the technical benefit of an organic electronic device comprising a hole injection layer and/or a hole generating layer according to the present invention. As proof-of-concept, the tandem OLEDs comprised two blue emitting layers.

A 15 Ω/cm² glass substrate with 90 nm ITO (available from Corning Co.) was cut to a size of 150 mm×150 mm×0.7 mm, ultrasonically cleaned with isopropyl alcohol for 5 minutes and then with pure water for 5 minutes, and cleaned again with UV ozone for 30 minutes, to prepare a first electrode.

The organic layers are deposited sequentially on the ITO layer at $10^{-5}$ Pa, see Table 1 and 2 for compositions and layer thicknesses. In the Tables 1 to 3, c refers to the concentration, and d refers to the layer thickness.

Then, the cathode electrode layer is formed by evaporating aluminum at ultra-high vacuum of $10^{-7}$ mbar and deposing the aluminum layer directly on the organic semiconductor layer. A thermal single co-evaporation of one or several metals is performed with a rate of 0, 1 to 10 nm/s (0.01 to 1 Å/s) in order to generate a homogeneous cathode electrode with a thickness of 5 to 1000 nm. The thickness of the cathode electrode layer is 100 nm.

The device is protected from ambient conditions by encapsulation of the device with a glass slide. Thereby, a cavity is formed, which comprises a getter material for further protection.

Current voltage measurements are performed at the temperature 20° C. using a Keithley 2400 source meter, and recorded in V.

Experimental Results

Using following model blue OLED device, performance of the inventive n-dopants/electron injection materials was compared with the closest state-of-art material C1 and with magnesium analogue B1.

Materials Used in Device Experiments

The formulae of the supporting materials mentioned in tables below are as follows:

F1 is

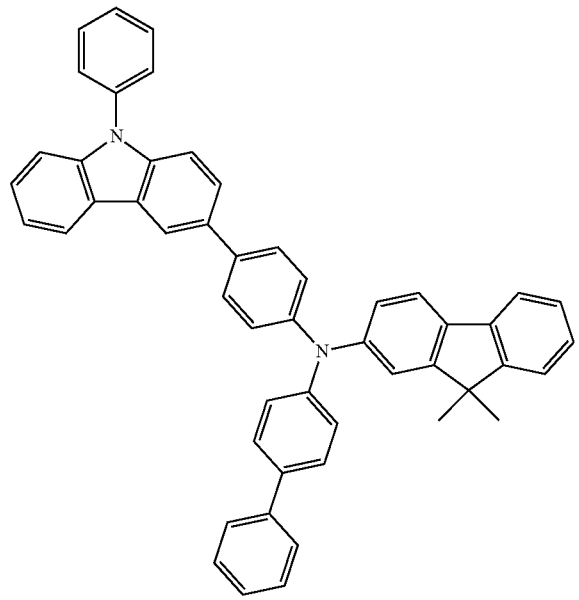 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21]

biphenyl-4-yl(9,9-diphenyl-9H-fluoren-2-yl)-[4-(9-phenyl-9H-carbazol-3-yl)phenyl]-amine, CAS 1242056-42-3, F2 is

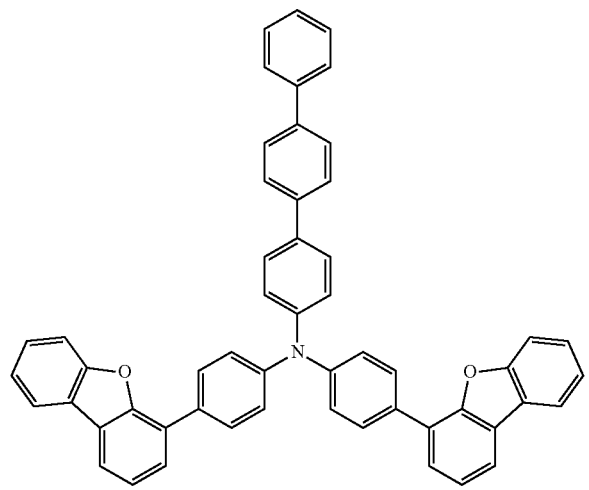 [SMILES: c1ccc(-c2ccc(-c3ccc(N(c4ccc(-c5cccc6c5oc5ccccc56)cc4)c4ccc(-c5cccc6c5oc5ccccc56)cc4)cc3)cc2)cc1]

N,N-bis(4-(dibenzo[b,d]furan-4-yl)phenyl)-[1,1':4',1''-terphenyl]-4-amine, CAS 1198399-61-9;

F3 is

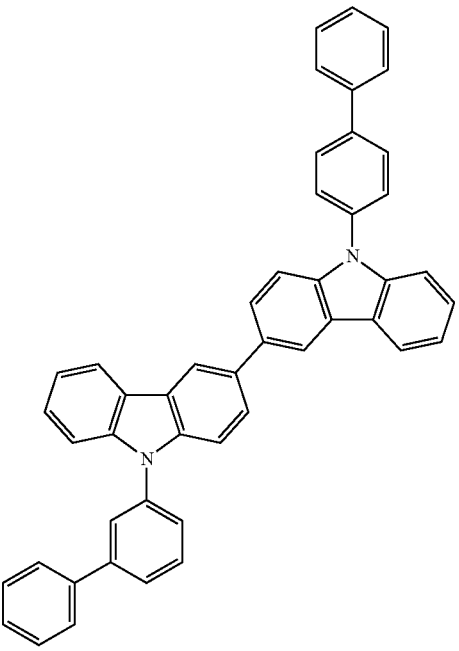 [SMILES: c1ccc(-c2ccc(-n3c4ccccc4c4cc(-c5ccc6c(c5)c5ccccc5n6-c5cccc(-c6ccccc6)c5)ccc43)cc2)cc1]

9-([1,1'-biphenyl]-3-yl)-9'-([1,1'-biphenyl]-4-yl)-9,9'H-3,3'-bicarbazole, CAS 1643479-47-3:

F4 is

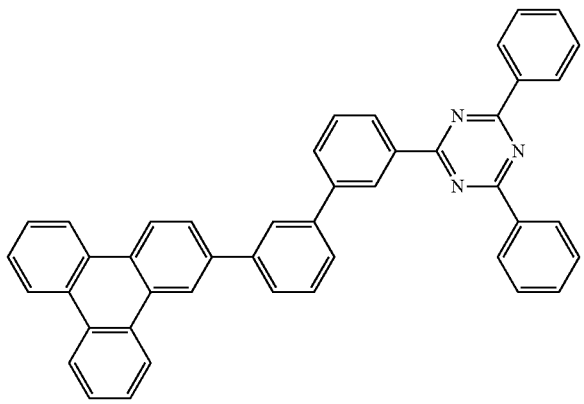 [SMILES: c1ccc(-c2nc(-c3ccccc3)nc(-c3cccc(-c4cccc(-c5ccc6c7ccccc7c7ccccc7c6c5)c4)c3)n2)cc1]

2,4-diphenyl-6-(3'-(triphenylen-2-yl)-[1,1'-biphenyl]-3-yl)1,3,5-triazine, 1638271-85-8;

PD-2 is

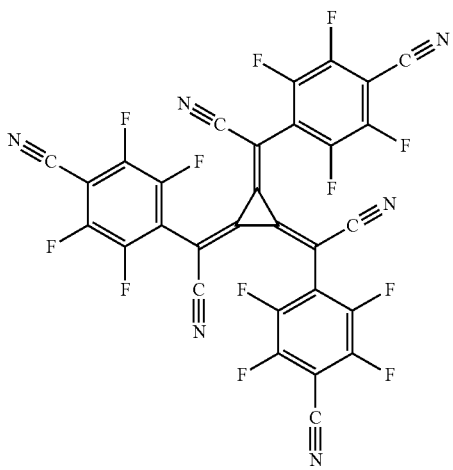 [SMILES: N#CC(=C1C(=C(C#N)c2c(F)c(F)c(C#N)c(F)c2F)C1=C(C#N)c1c(F)c(F)c(C#N)c(F)c1F)c1c(F)c(F)c(C#N)c(F)c1F]

4,4',4''-((1E,1'E,1''E)-cyclopropane-1,2,3-triylidenetris(cyanomethanylylidene))tris(2,3,5,6-tetrafluorobenzonitrile), CAS 1224447-88-4.

H06 is an emitter host and DB-200 is a blue fluorescent emitter dopant, both commercially available from SFC, Korea.

Exemplary ETL matrix compounds M1 and M2 have the following formulae:

M1 is

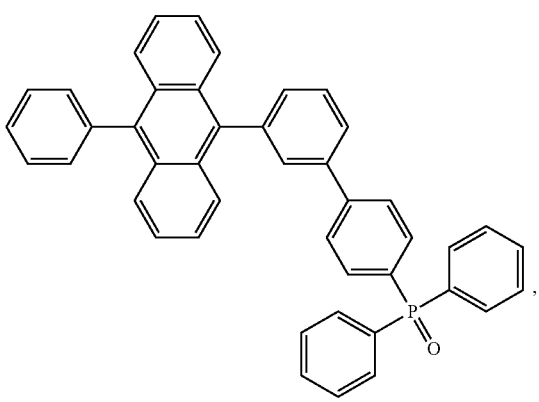 [SMILES: O=P(c1ccccc1)(c1ccccc1)c1ccc(-c2cccc(-c3c4ccccc4c(-c4ccccc4)c4ccccc34)c2)cc1]

diphenyl(3'-(10-phenylanthracen-9-yl)-[1,1'-biphenyl]-4-yl)phosphine oxide, CAS 2138371-45-4, published in EP 3 232 490 and WO2017/178392, and in the present invention serves as an ETL matrix for the inventive n-dopants.

M2 is

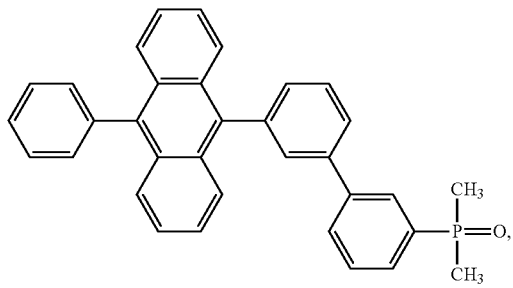 [SMILES: CP(C)(=O)c1cccc(-c2cccc(-c3c4ccccc4c(-c4ccccc4)c4ccccc34)c2)c1]

dimethyl(3'-(10-phenylanthracen-9-yl)-[1,1'-biphenyl]-3-yl)phosphine oxide, CAS 2101720-06-1, published in WO2017/102822, and in the present invention serves as an ETL matrix for the inventive n-dopants.

Structure of the model device is shown in Table 1a

TABLE 1a

| layer | composition | c [wt %] | d [nm] |
|---|---|---|---|
| anode | Ag | 100 | 100 |
| HIL | F1:PD-2 | 92:8 | 10 |
| HTL | F1 | 100 | 117.5 |
| EBL | F2 | 100 | 5 |
| EML | H06:BD200 | 97:3 | 20 |
| HBL | F3:F4 | 70:30 | 5 |
| ETL | ETL matrix:n-dopant | 70:30 | 31 |
| EIL | Yb | 100 | 2 |
| cathode | Ag | 100 | 11 |
| cap layer | F1 | 100 | 75 |

Performance of the model device in terms of the operational voltage U, CIE coordinate y in the color space, luminance, current density j, current efficiency $C_{eff}$, lifetime (defined as a time in which the luminance of the device operated at the current density j falls to 97% of its initial value) and voltage rise d(U) after 100 hour operation at 85° C. is given in Table 1b.

TABLE 1b

| ETL composition | U [V] | CIE 1931 y | Luminance [cd/m²] | j [A/m²] | $C_{eff}$ [cd/A] | $LT_{97}$ [h] | dU (100 h) [%] at 85° C. |
|---|---|---|---|---|---|---|---|
| M1:C1 | 3.62 | 0.048 | 953 | 122 | 7.8 | 240 | 3.6 |
| M1:B1 | 5.09 | 0.047 | 932 | 196 | 4.8 | 34 | 8.5 |
| M1:E1 | 3.61 | 0.047 | 932 | 122 | 7.6 | 238 | 3.4 |
| M1:E2 | 3.57 | 0.047 | 932 | 123 | 7.6 | 233 | 2.7 |
| M2:C1 | 3.56 | 0.049 | 974 | 121 | 8.0 | 234 | 3.7 |
| M2:B1 | 3.54 | 0.049 | 974 | 121 | 8.0 | 221 | 1.4 |
| M2:E1 | 3.55 | 0.048 | 953 | 121 | 7.9 | 232 | 1.6 |
| M2:E2 | 3.55 | 0.048 | 953 | 122 | 7.8 | 242 | 1.8 |

In comparison with state-of-art compound C1, the selection of Ca and especially of Sr borates brings improved operational voltage stability at elevated temperatures.

Ca and Sr borates exhibit applicability in abroad spectrum of phosphine oxide matrices, whereas magnesium analogues are suitable only for dialkyl phosphine oxide matrices, particularly for dimethyl phosphine oxide matrices.

In comparison with Ba analogues, Ca and Sr borates exhibit favourable thermal properties. Compounds E1 and E2 can be preparatively sublimed at pressures about $10^{-3}$ Pa and co-deposited with suitable matrices in state-of-art industrial vacuum thermal evaporation (VTE) facilities, whereas their Ba analogue decomposes. Poor thermal stability preventing their utilizability in industrial VTE processes has been generally observed by the inventors also for other borate salts lacking the heterocyclic group.

It can be summarized that it was surprisingly found by the inventors that compounds E1 and E2 in accordance with the invention show superior performance over the compounds B1 and B2 of the prior art.

The features disclosed in the foregoing description, in the claims and/or in the accompanying drawings may, both separately and in any combination thereof be material for realizing the invention in diverse forms thereof.

The invention claimed is:

1. Electronic device comprising a semiconducting layer, wherein the semiconducting layer comprises at least one borate complex comprising (i) Sr and (ii) at least one borate ligand, wherein the borate ligand comprises at least one heterocyclic group.

2. Electronic device according to claim 1, wherein the heterocyclic group is a heteroaryl group.

3. Electronic device according to claim 2, wherein the heterocyclic group is a $C_2$-$C_{30}$ heteroaryl group.

4. Electronic device according to claim 1, wherein the heterocyclic group comprises one or more heteroatoms independently selected from N, O and S.

5. Electronic device according to claim 1, wherein the heterocyclic group comprises a five-membered heterocyclic ring.

6. Electronic device according to claim 1, wherein the heterocyclic group comprises an azole or a diazole ring.

7. Electronic device according to claim 1, wherein the heterocyclic group is a 1,2-diazole group.

8. Electronic device according to claim 1, wherein the borate ligand comprises at least two heterocyclic groups.

9. Electronic device according to claim 8, wherein at least two heterocyclic groups in the borate ligand have, each individually, their heteroatoms in the beta-position with respect to the central boron atom of the borate ligand.

10. Electronic device according to claim 1, wherein the borate complex has the following formula (I)

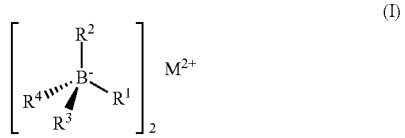

(I)

wherein M is Sr; and
$R^1$ to $R^4$ are independently selected from the group consisting of H, substituted or unsubstituted $C_6$ to $C_{30}$ aryl and substituted or unsubstituted $C_2$ to $C_{30}$ heteroaryl.

11. Electronic device according to claim 1, wherein the semiconducting layer is a charge transport layer and/or a charge injection layer and/or a charge generation layer.

12. Electronic device according to claim 11, wherein the charge transport layer is an electron transport layer and/or the charge injections layer is an electron injection layer and/or the charge generation layer is an electron generation layer.

13. Electronic device according to claim 1, wherein the semiconducting layer further comprises at least one organic matrix compound.

14. Electronic device according to claim 1, wherein the electronic device is an electroluminescent device.

15. Electronic device according to claim 14, wherein the electronic device is an organic light emitting diode.

16. Method for preparing an electronic device according to claim 1, wherein the process comprises the steps of
   (i) evaporating a borate complex comprising Sr and at least one borate ligand, wherein the borate ligand comprises at least one heterocyclic group, at an elevated temperature and optionally at a reduced pressure, and
   (ii) depositing the vapor of the borate complex on a solid support.

17. Method according to claim 16, wherein the borate complex has the general formula (I)

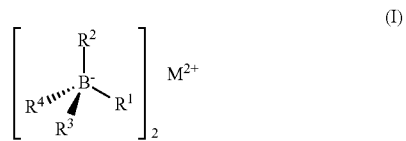

(I)

wherein M is Sr; and
$R^1$ to $R^4$ are independently selected from the group consisting of H, substituted or unsubstituted $C_6$ to $C_{30}$ aryl and substituted or unsubstituted $C_2$ to $C_{30}$ heteroaryl.

* * * * *